United States Patent [19]
Li

[11] Patent Number: 6,067,228
[45] Date of Patent: May 23, 2000

[54] HEAT SINK

[75] Inventor: Ji-Ming Li, Taipei, Taiwan

[73] Assignee: Caesar Technology, Inc., Taipei, Taiwan

[21] Appl. No.: 09/276,651

[22] Filed: Mar. 26, 1999

[51] Int. Cl.⁷ .................................................. H05K 7/20
[52] U.S. Cl. ..................... 361/695; 361/694; 361/690; 361/704; 361/707; 361/719; 165/80.3; 174/15.1; 174/16.1; 174/16.3; 257/721
[58] Field of Search .................... 361/688–691, 361/694–697, 704, 707, 709, 717–720; 257/712, 721; 174/15.1, 16.1, 16.3; 165/80.3, 185

[56] References Cited

U.S. PATENT DOCUMENTS 5,132,780  7/1992  Higgins, III ........................... 257/722
5,760,333  6/1998  Kitahara et al. ....................... 361/703
5,896,917  4/1999  Lemont et al. ....................... 165/80.3

*Primary Examiner*—Leo P. Picard
*Assistant Examiner*—Boris L. Chervinsky
*Attorney, Agent, or Firm*—Rosenberg, Klein & Lee

[57] ABSTRACT

The present invention discloses a heat sink for enhancing heat dissipation efficiency of an electronic device. The heat sink includes a base for accommodating at least an electronic device, a dissipation plate overlaid on the base for absorbing and dissipating heat generated by the electronic device, and a fan for generating airflow. A side wall of the base is formed with at least an air duct for guiding the airflow generated by the fan through a bottom of the electronic device, thereby enhancing heat dissipation efficiency of the electronic device.

2 Claims, 5 Drawing Sheets

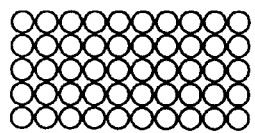
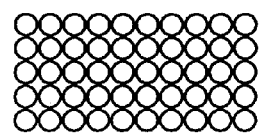
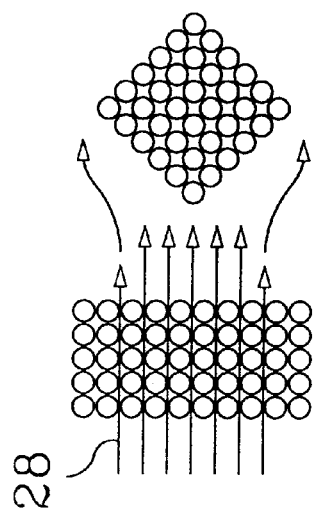
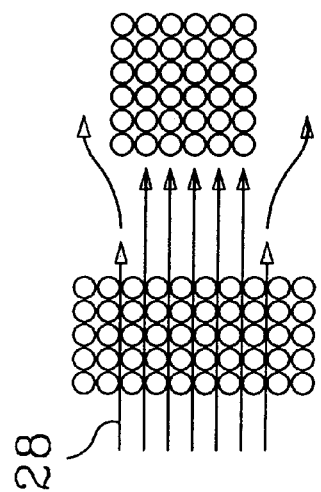
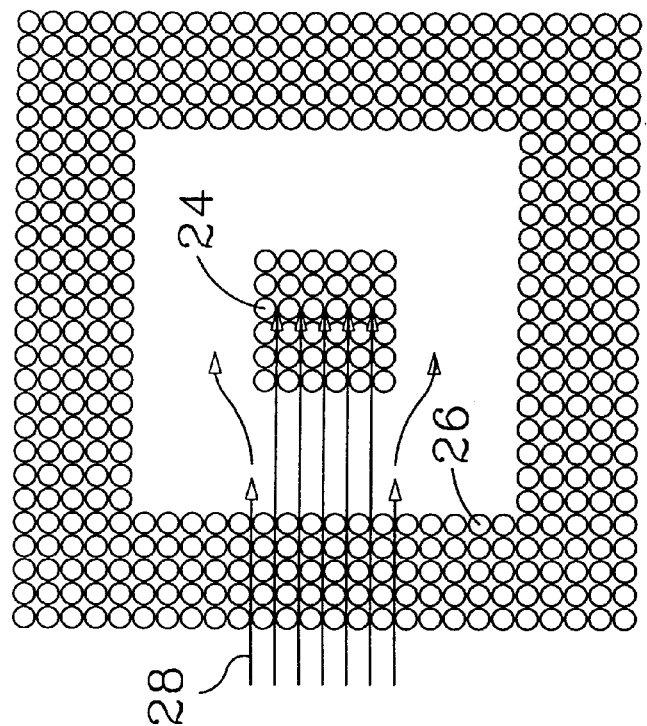

HEAT SINK

FIELD OF THE INVENTION

The present invention relates to a heat sink, and more particularly, to a heat sink for an ball grid array (BGA) package.

BACKGROUND OF THE INVENTION

Along with advancement of the integrated circuit technique, size of an integrated circuit is reduced and integration density is increased while function thereof is complicated. Reduced size, increased density and complicated function all mean increased heat generation per unit area.

Since a semiconductor chip contains extremely dense components, the operation frequency gets higher and the structure becomes more complicated, the heat generated may destroy the chip or degrade the lines thereof, resulting in reliability reduction or life time shortening, thereby increasing cost and causing damage.

Therefore, it is important to provide a heat sink to suppress operation temperature of a chip. In the case of BGA package, however, since the product is compact, it is fragile so that to externally provide a heat sink is considerably difficult. Besides, intensive care must be taken during the mounting process to avoid excessive cost and damage of the chip, which reduces yield thereof.

SUMMARY OF THE INVENTION

The present invention is to overcome the prior art problems.

An object of the present invention is set forth a heat sink for an electronic device, comprising a base for accommodating the electronic device, a dissipation plate overlaid thereon, and a fan for heat dissipation. A side wall of the base is formed with an air duct for guiding airflow blown by the fan to prevent the electronic device from overheating and overcome the prior art problem of externally providing a heat sink.

Providing a heat sink on an electronic device may affect the yield. To this, in another aspect of the present invention, a side wall of a base for accommodating an electronic device is formed with an air duct for guiding airflow from a fan to dissipate heat from the electronic device. Therefore, another object of the present invention is to provide a special base.

These and other objects, features and advantages of the present invention will become apparent to those skilled in the art upon consideration of the following description of the preferred embodiments of the present invention taken in conjunction with the accompanying drawings

BRIEF DESCRIPTION OF THE DRAWINGS

FIG. 4a is a schematic view showing airflow through a ball grid array;

FIG. 4b is a schematic view showing airflow through a ball grid array;

FIG. 4c is a schematic view showing airflow through a ball grid array; and

DETAILED DESCRIPTION

The present invention is to design a structure comprising a dissipation plate, a base for accommodating at least an electronic device and a fan wherein airflow generated by the fan is blown through an air duct in a side wall of the base toward the electronic device to dissipate heat produced by the electronic device. Hereinafter, a BGA package is exemplified.

Figure 1:
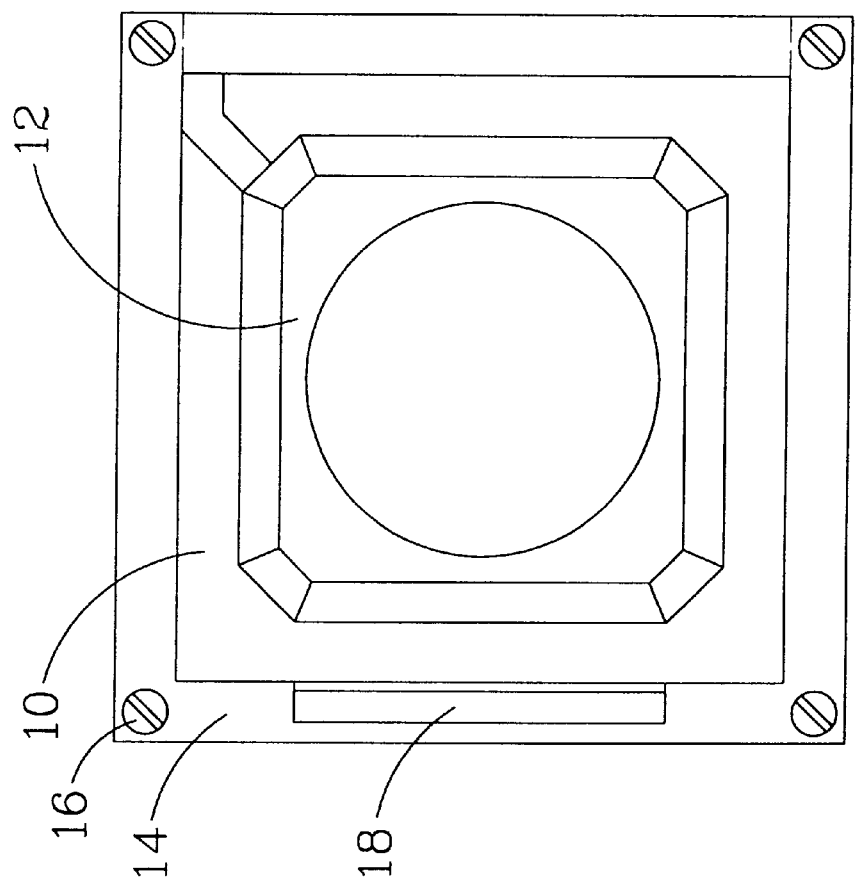
FIG. 1 is a plan view showing a base of the present invention.

FIG. 1 is a plan view showing a base according to the present invention. As shown, a package layer 12 of a BGA package covers a substrate 10. A base 14 having a frame shape for accommodating the substrate 10 is threaded with a circuit board (not shown) by a screw 16 and is provided at a side wall thereof with an air duct 18 for guiding airflow.

Figure 2:
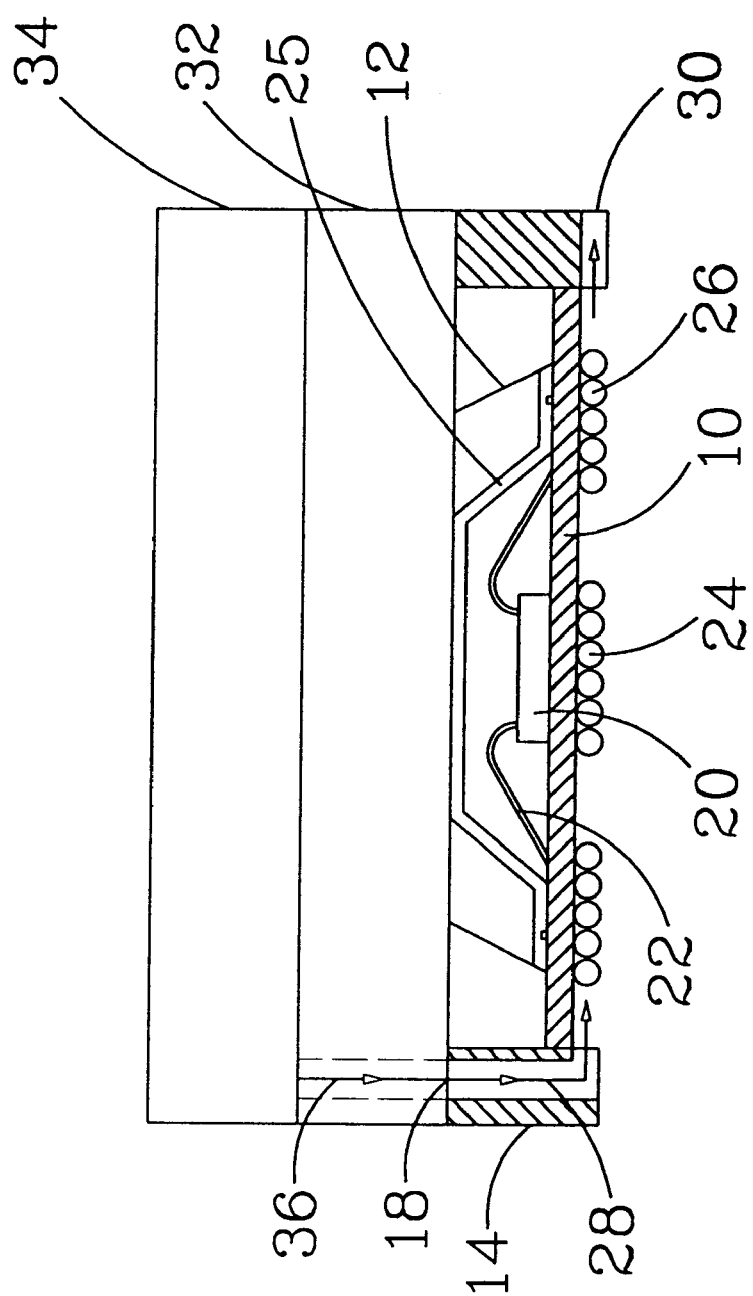
FIG. 2 is a sectional view of an embodiment of the present invention.

FIG. 2 is a sectional view of an embodiment of the present invention. A fan 34 for producing airflow for heat dissipation is positioned on a dissipation plate 32. A portion of the airflow generated by the fan 34 flows toward the dissipation plate 32 to enhance heat dissipation efficiency thereof, while the remaining portion of the airflow 28 flows toward bottom of a BGA package through an air ducts 36 and 18.

The dissipation plate 32 absorbs and dissipates heat generated by the BGA package and conducted upward. The air duct 36 in the dissipation plate 32 is in communication with the air duct 18 in the base 14 so that the airflow 28 from the fan 34 can be guided to the air duct 18 through the air duct 36.

The BGA package is electrically connected with other circuit boards (not shown) through balls 26. A chip 20 in the BGA package is connected with the substrate 10 through leads 22. Heat generated by the chip 20 flows in two (upward and downward) directions. In the upward direction, the heat generated by the chip 20 is dissipated outward through a fin 25. In the downward direction, the heat is conducted to the circuit boards and dissipated thereon through the substrate 10 and balls 24. The chip 20, package layer 12 and substrate 10 constituting the electronic devise.

The base 14 is provided with the air duct 18 and an air outlet 30. The airflow 28 from the fan 34 flows through the air duct 18 and the bottom of the substrate 10 to the air outlet 30, thereby reducing temperature of the balls.

Figure 3:
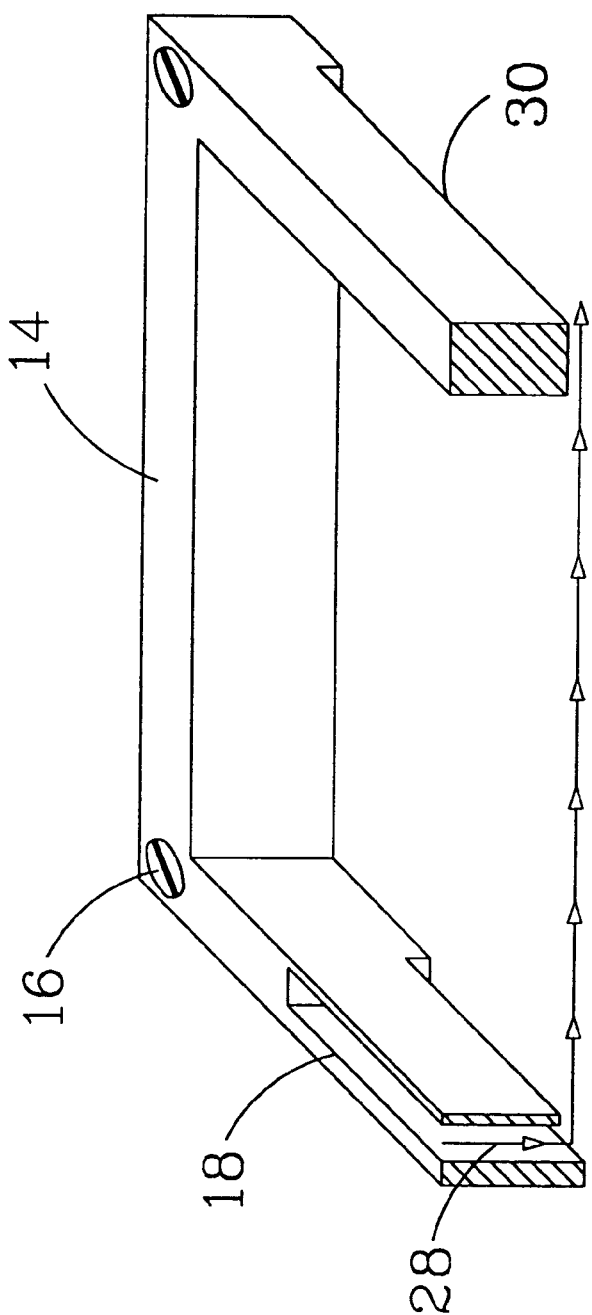
FIG. 3 is a perspective cross sectional partially cut-a-way view showing airflow in the base of the present invention.

FIG. 3 is a perspective cross sectional partially cut-a-way view showing the airflow in the base of the present invention. The base 14 is fixed to the circuit board by the screw 16. The airflow produced by the fan flows toward the space in the base 14 for accommodating the BGA package to take out the heat generated by the package through the air outlet 30.

FIG. 4a is a schematic view showing the airflow through a ball grid array. The airflow 28 is blown from the air duct 18 toward the BGA package. As shown, the airflow 28 is blown toward balls 24 through balls 26. Since most of the heat generated by the chip 20 in the BGA package is accumulated in the balls 24, the airflow 28 can effectively enhance heat dissipation of the BGA package.

The BGA package can have different ball grid arrays such as those shown in FIGS. 4b and 4c in which only directions of the airflow 28 are different but anyone can be used for heat dissipation.

Figure 5:
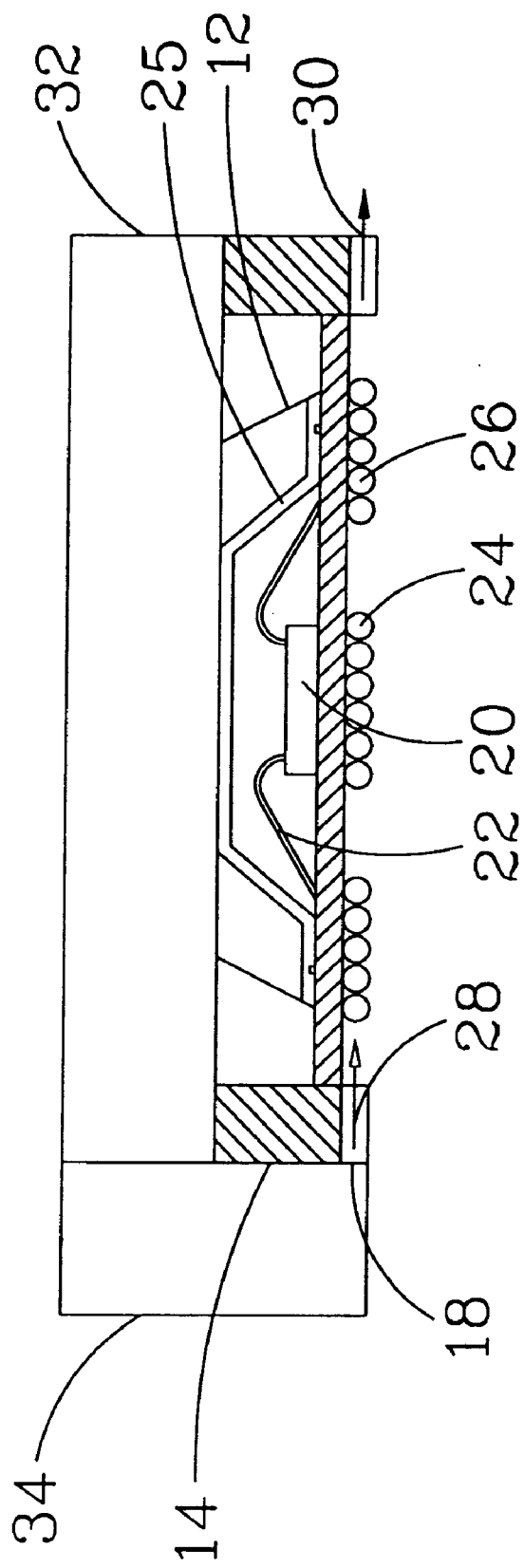
FIG. 5 is a sectional view of another embodiment of the present invention.

FIG. 5 is a sectional view of another embodiment of the present invention in which a fan 34 is provided beside a dissipation plate 32 and a base 14 to decrease thickness of the whole apparatus. A portion of airflow from the fan 34 is blown toward the dissipation plate 32 to enhance heat dissipation efficiency of the dissipation plate 32, while the remaining portion of the airflow 28 is blown toward bottom of a BGA package through an air duct 18.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A heat sink, comprising:

a base having a hollow frame shape to be mounted on a circuit board, for an electronic device mounted therein, said base having a side wall formed with at least one air duct and another side wall formed with an air outlet;

a dissipation plate overlaid on said base and formed with at least one air duct in communication with said air duct of said base; and a fan overlaid on said dissipation plate for blowing air toward a bottom of said electronic device through said air ducts of said dissipation plate and said base passing said air along a bottom surface of said electronic device and through said air outlet.

2. A heat sink, comprising:

a base having a hollow frame shape for accommodating an electronic device therein, said base having a side wall formed with at least one air duct and another side wall formed with an air outlet;

a dissipation plate overlaid on said base; and a fan provided at a side of said dissipation plate and said base, for blowing air toward a bottom of the electronic device through said air duct of said base passing the air along a bottom surface of said electronic device and though said air outlet.

\* \* \* \* \*